(12) United States Patent
Hauenstein

(10) Patent No.: US 7,554,188 B2
(45) Date of Patent: Jun. 30, 2009

(54) LOW INDUCTANCE BOND-WIRELESS CO-PACKAGE FOR HIGH POWER DENSITY DEVICES, ESPECIALLY FOR IGBTS AND DIODES

(75) Inventor: Henning Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 153 days.

(21) Appl. No.: 11/786,388

(22) Filed: Apr. 11, 2007

(65) Prior Publication Data

US 2007/0241393 A1    Oct. 18, 2007

Related U.S. Application Data

(60) Provisional application No. 60/791,860, filed on Apr. 13, 2006.

(51) Int. Cl.
*H01L 23/52*    (2006.01)

(52) U.S. Cl. ..................... 257/692; 257/577
(58) Field of Classification Search ............. 257/577, 257/692
See application file for complete search history.

(56) References Cited

U.S. PATENT DOCUMENTS

| | | |
|---|---|---|
| 6,584,681 B2 | 7/2003 | Lorenz et al. |
| 6,836,006 B2 | 12/2004 | Muto et al. |

OTHER PUBLICATIONS

International Search Report issued Apr. 10, 2008 in corresponding PCT Application Serial No. PCT/US07/09037.

*Primary Examiner*—Douglas M Menz
(74) *Attorney, Agent, or Firm*—Ostrolenk, Faber, Gerb & Soffen, LLP

(57) ABSTRACT

A power semiconductor package that includes at least two semiconductor devices electrically coupled to one another through a common metallic web.

14 Claims, 6 Drawing Sheets

LOW INDUCTANCE BOND-WIRELESS CO-PACKAGE FOR HIGH POWER DENSITY DEVICES, ESPECIALLY FOR IGBTS AND DIODES

RELATED APPLICATION

This application is based on and claims priority to U.S. Provisional Application Ser. No. 60/791,860, filed on Apr. 13, 2006, entitled Low Inductance Bond-Wireless Co-package for High Power Density Devices, Especially for IGBT's and Diodes, to which a claim of priority is hereby made and the disclosure of which is incorporated by reference.

BACKGROUND OF THE INVENTION

Modern applications increasingly demand the capability to manage high currents in a very small space and often in harsh environments, e.g. large temperature changes during the lifetime of the package. Particularly, in the automotive sector, due to the increasing electrification of functions the high current demand has increased enormously; e.g. inverter and E-motor drives for hybrid car applications, starter-generator applications, high power DC-DC converter or x-by-wire applications like electric power steering or electric braking. These applications need high current carrying capabilities on a minimum space challenging the state-of-the-art power modules in terms of achievable power density. To respond to the demand for high current applications, new technologies need to be developed to overcome the thermal and electrical limitations of the state-of-the-art power switch packages and power modules.

Progress in semiconductor processes and device design have extended the performance limits of semiconductor devices beyond the capabilities of the state-of-the-art packages. Therefore, newer state-of-the-art packaging technologies for power devices try to achieve low inductivity and better thermal connectivity to a heatsink through bond wireless connection techniques to maximize the thermal contact area of the power device to a heatsink and/or maximize the electrical connection of the device to a power terminal/leadframe.

U.S. Pat. No. 6,624,522, and U.S. patent application Ser. No. 11/641,270 both assigned to the assignee of the present application, disclose bond-wireless packaging techniques.

The concepts disclosed in the above follow a similar principle: By connecting the topside of the power device (especially the source or the emitter contact) to a larger metal area the package gains a higher current carrying capability, better thermal properties and a lower inductivity at the same time to achieve high power densities, good thermal performance, improved low inductivity and higher reliability.

The packaging concept disclosed in U.S. patent application Ser. No. 11/641,270 solves the main problems regarding thermal mismatch, bond wire inductance, high current carrying capability and package inductance.

The inductance of the packaged device is an important contributor to the final performance of the power device. State-of-the-art power modules normally try to reduce package resistance by minimizing Cu-leads and distances between various devices. It is especially important in applications which use IGBT devices as power switches that the so called free wheeling diode is connected to the corresponding IGBT using a low inductance connection. The diode is a "partner device" for the IGBT and carries the inductive current when the IGBT is switched off preventing the IGBT from break through due to inductive current flow. The typical combination of IGBT and diode is shown in FIG. 1.

It is a conventional packaging technique to solder and wire-bond the diode as close as possible to the IGBT on a substrate like a DBC, PCB or IMS in order to minimize parasitic inductance between the diode and the IGBT.

It is also a conventional packaging technique to co-package an IGBT and a diode in one package by soldering both devices on a shared leadframe, attach wire bonds and finally passivate this package with e.g. a mold plastic.

BRIEF DESCRIPTION OF THE INVENTION

It is an object of the present invention to provide a co-packaging concept that includes all the advantages of the stress reduced horseshoe-shaped DBC-can described in U.S. patent application Ser. No. 11/641,270.

It is another object of the present invention to improve the existing state-of-the-art by introducing a stress reduced and bond wireless co-package for two discrete power devices especially for a combination of an IGBT and an anti-parallel diode or free-wheeling diode.

A power semiconductor package according to the present invention includes a metallic body having a web portion configured for electrical and mechanical coupling using a conductive (e.g. solder or a conductive epoxy) adhesive to active electrodes of at least two semiconductor devices, and a connector portion extending from an edge of the web portion to connect electrically the active electrodes of the semiconductor devices, a first semiconductor die and a second semiconductor die electrically and mechanically coupled to said web portion, a ceramic insulation body directly bonded at one surface thereof to a surface of said metallic body, and another metallic body directly bonded to another opposing surface of said ceramic insulation body.

As will become apparent from the disclosure set forth below a package according to the present invention offers the following advantages:
a) improved mechanical properties:
  i) stress-reduced two-sided cooling of power devices;
  ii) a housing that is thermally compatible with Si (i.e. matched thermal expansion coefficient);
  iii) increased reliability due to the matching thermal expansion coefficients;
b) improved electrical and thermal properties:
  i) low inductance due to a shared contact pad for the diode and the IGBT (minimum distance between the devices and no inductive bond wires);
  ii) low inductance of the overall co-package due to the use of a large soldered contact area for all pads of the two devices;
  iii) increased current/power capability compared to the state-of-the-art technologies due to low electrical and thermal resistance using solder die attach and large contact areas;
  iv) electrical isolation (HV and automotive suitable);
  v) efficient usage of the available package space and therefore optimized power;
  vi) smaller temperature changes during power cycling due to the fact that either the IGBT or the diode are generating power losses inside of the co-package keeping the overall temperature relatively constant (If only one device is inside the DBC-can a temperature change is generated between switch-on and switch-off state of the device leading to a faster solder wear out due to the fast changing temperatures at the solder joint (typically at switching frequencies of 10-100 kHz). This can be avoided or minimized by the co-packaging of the diode and the IGBT where power loss are more homogeneously generated since the diode is generating conduction losses when the IGBT is switched off and vice versa when the IGBT is switched on. Since both devices share a contact pad the temperature during the switching operation does not change too much compared to a single-die package);

c) improved manufacturing and handling properties:

i) pre-assembled co-packaged components is suitable for easy handling and integration into power modules;

d) low manufacturing tests and costs:

i) a high volume production possibility without application specific customization which will be done by the end-user;

ii) die attach to the DBC-can can be done on a DBC-card instead of handling and assembling discrete co-packages;

iii) electrical/parametric end-tests after or during assembly can be done at the DBC-card level before separating the card into discrete co-packages;

iv) transportation from the fab to the end-user can be done by using the DBC-card assembly as a whole which offers protection without the need for a sophisticated additional transport package;

e) unique properties for end users:

i) pre-assembled discrete component co-package is matching the thermal expansion coefficient of the state-of-the-art power substrates and therefore attractive for a large variety of applications;

ii) application-flexibility of the sub-assembly which can easily be combined into an application specific circuit at the end-customer using the co-pack of an IGBT and a diode as basic "construction-kit";

iii) application-flexibility due to various die attach possibilities inside of the DBC-can like up-side down or bottom up, providing optimum low and high side driver or half/full-bridge configurations just by combining several DBC-can packaged die on a power substrate or in a power module;

iv) cost-effective material choice by matching the ceramic type of the DBC-can to the application requirements (e.g. $Al_2O_3$, AlN, SiN, . . . ceramics);

f) unique properties related to the implementation of optional features:

i) an additional EMI screening function can be implemented using the top-Cu layer of the DBC-can;

ii) an additional heat-spreader can be mounted on top of the DBC-can while the bottom of the die is soldered to the cooled power substrate of the application giving highly efficient double sided cooling for highest power densities;

iii) easy integration of smartness like a gate-driver by mounting on top of the co-pack DBC-can.

The main application field for a package according to the present invention will be in high power circuits and modules switching high currents or high voltages and requiring low inductance and EMI-screening. A package according to the present invention is also well-suited for high voltage applications using a combination of IGBTs and diodes, and applications under harsh environmental conditions or tough temperature cycling requirements like automotive or safety critical functions with high reliability demand.

Other features and advantages of the present invention will become apparent from the following description of the invention which refers to the accompanying drawings.

BRIEF DESCRIPTION OF THE DRAWING(S)

DETAILED DESCRIPTION OF THE FIGURES

Figure 2:
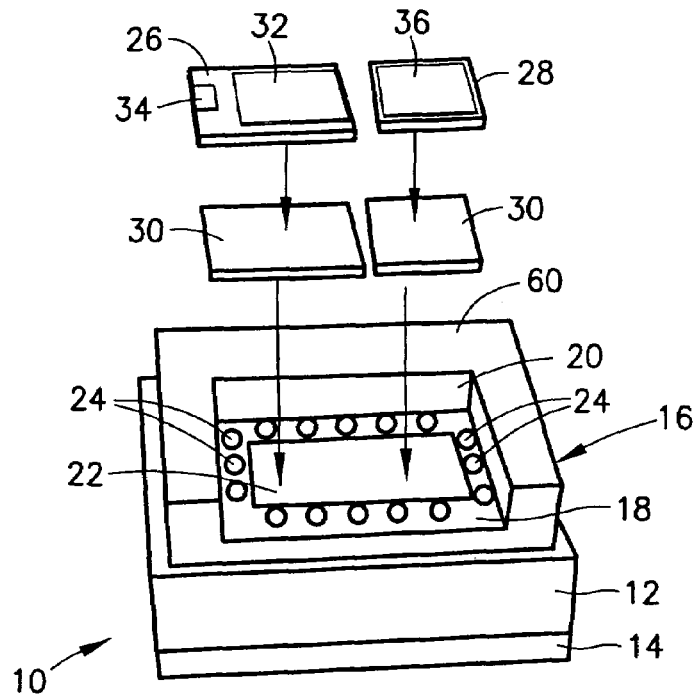
FIG. 2 illustrates a package according to the first embodiment of the present invention.

Referring to FIG. 2, a package according to the present invention includes a basic building block 10, which has been described in co-pending U.S. application Ser. No. 11/641, 270, entitled Package for High Power Density Devices, assigned to the assignee of the present application, the entire disclosure of which incorporated by reference. Basic building block 10 (sometimes referred to herein as DBC-can) includes a dielectric ceramic body 12 (e.g. $Al_2O_3$), a metallic body 14 directly bonded to one surface of ceramic body 12, and a metallic connector 16 directly bonded to another, opposite surface of ceramic body 12. Metallic body 14 may be a flat metallic web that is formed from copper, aluminum or the like material. Metallic connector 16 may also be formed from copper, aluminum, or the like and includes a rectangular or square web portion 18, and a lead portion 20 that extends from (preferably in a vertical direction) web portion 18. In the first embodiment of the present invention, lead portion 20 is horse-shoe-shaped, and extends from three edges of web portion 18, leaving one edge open. Preferably, web portion 18 includes a die connection area 22 for electrical connection to an electrode of a semiconductor die, and a plurality of spaced circular dimples 24 surrounding the die connection area 22. Each dimple 24 is a depression formed (by etching or the like method) in web portion 18.

In the first embodiment of the present invention, an IGBT die 26 and diode 28 (e.g. Schottky diode, PN diode, or the like diode) are assembled onto die connection area 22 of web portion 18. Specifically, the collector electrode (not shown) of IGBT 26 and the cathode electrode (not shown) of diode 28 are electrically and mechanically connected to connection area 22 using a conductive adhesive body 30 such as solder or a conductive epoxy. That is, a conductive adhesive body 30 is disposed between the collector electrode of IGBT die 26 and the cathode electrode of diode 28 and connection area 22, whereby the collector electrode and the cathode electrode are electrically and mechanically connected to web portion 18 and electrically connected to one another whereby low inductance is achieved. Note that dimples 24 serve as a barrier against conductive adhesive 30 (e.g. during reflow where solder is used) whereby IGBT die 26 and diode 28 can be kept spaced from lead 20 and the combination of IGBT 26, and diode 28 can be preserved. Dimples 24 can also be located between diode 28 and IGBT 26 to keep space between the two dice (not shown in the figures). Emitter electrode 32 and gate electrode 34 of IGBT 26 which are disposed on a surface opposite to the collector electrode, and anode electrode 36 of diode 28, which is disposed on a surface opposite the cathode electrode, are preferably readied for flip-mounting onto a conductive pad of a circuit board or the like. Flip-mounting or flip-mounted as used herein refers to electrical and mechanical mounting using a conductive adhesive body (e.g. solder, conductive epoxy or the like) in which a conductive adhesive body is disposed between an electrode of the die and a conductive pad on a circuit board, or a die receiving area of a leadframe or the like. Note that lead 20 includes an external connection surface 60 which is preferably coplanar with the free surfaces of the electrodes of die 26, 28, and serves to connect the collector electrode of IGBT 26 and the cathode electrode of diode 28 to a conductive pad of a circuit board through flip-mounting.

A package according to the second embodiment has two open sides which advantageously allows for filling the space underneath the DBC-can with an under filler or an isolating gel after soldering the DBC-can on a substrate.

Figure 3:
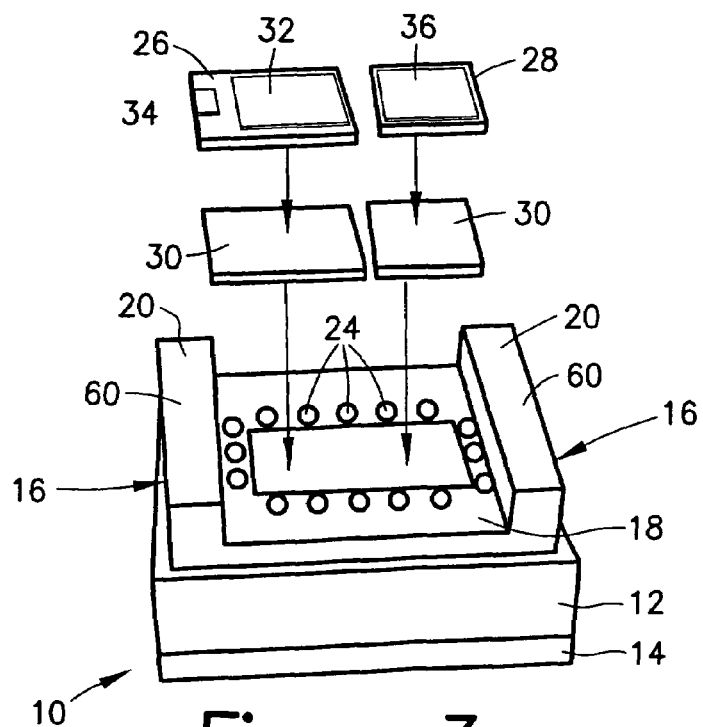
FIG. 3 illustrates a package according to the second embodiment of the present invention.

Referring to FIG. 3, in which like numerals identify like features, in a package according to the second embodiment of the present invention, the horseshoe-shaped lead 20 is replaced with two spaced and oppositely disposed leads 20 each extending vertically from a respective edge of web 18 of connector 16. In all other respects, a package according to the second embodiment is identical to a package according to the first embodiment.

Figure 1:
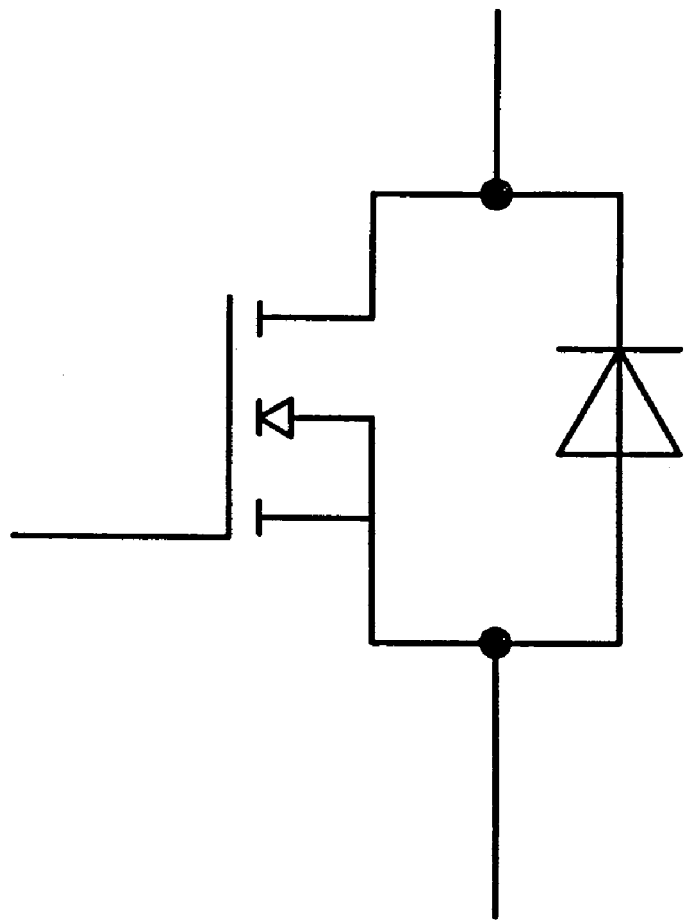
FIG. 1 illustrates a circuit diagram for an IGBT and anti-parallel diode according to the prior art.
Figure 4:
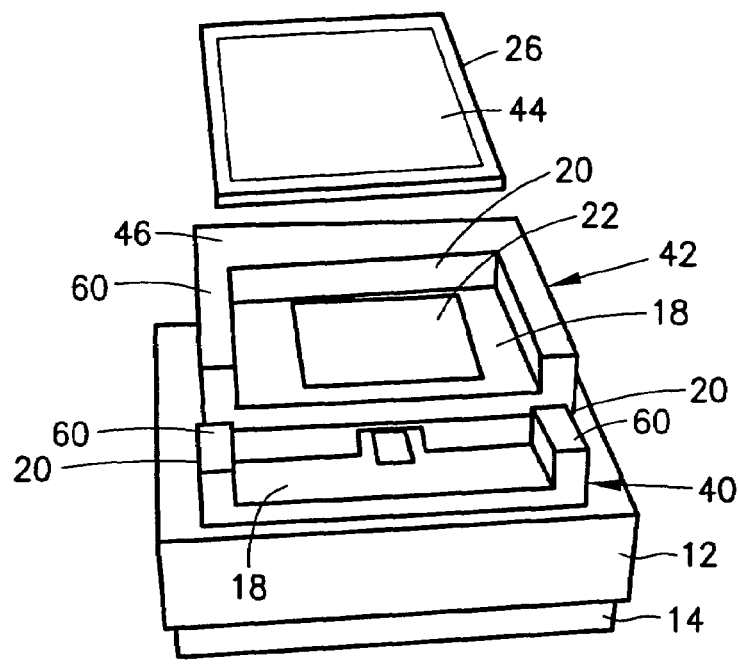
FIG. 4 illustrates a package according to the third embodiment of the present invention.

Referring to FIG. 4, in which like numerals identify like features, a package according to the third embodiment includes two spaced and electrically isolated connectors 40, 42. Connector 40 includes a die connection area 22 for electrical connection (using a conductive adhesive such as solder or conductive epoxy) to the gate electrode (not shown) of an IGBT die 26, while connector 42 includes a die connection area 22 for electrical connection (using a conductive adhesive such as solder or conductive epoxy) to the emitter electrode (not shown) of IGBT die 26. Note that the electrodes of the die may be bumped for connection to surfaces 22. Note further that collector electrode 44 of IGBT die 26 is preferably coplanar with the connection surface 46 of lead 42 and readied for flip-mounting onto a conductive pad of a circuit board or the like substrate. Note also that in a package according to the third embodiment, connector 42 includes a horseshoe-shaped lead 20 similar to the lead 20 in the first embodiment, while connector 40 includes two opposing leads 20 extending from opposite edges of a web, similar to leads 20 of the second embodiment. Furthermore, note that in a package according to the third embodiment diode 28, although not shown, may be electrically mounted on metallic body 14, and then connected to form the circuit shown in FIG. 1 during the assembly of the package in a module or the like integrated device. A clip, or wirebonds (not preferred can be used to accomplish such a connection. Note that, alternatively, the anode electrode of a diode 28 may be coupled to connection area 22 of connector 42, whereby the anode electrode and the emitter electrode of IGBT 26 can be electrically coupled through connector 42.

Figure 5:
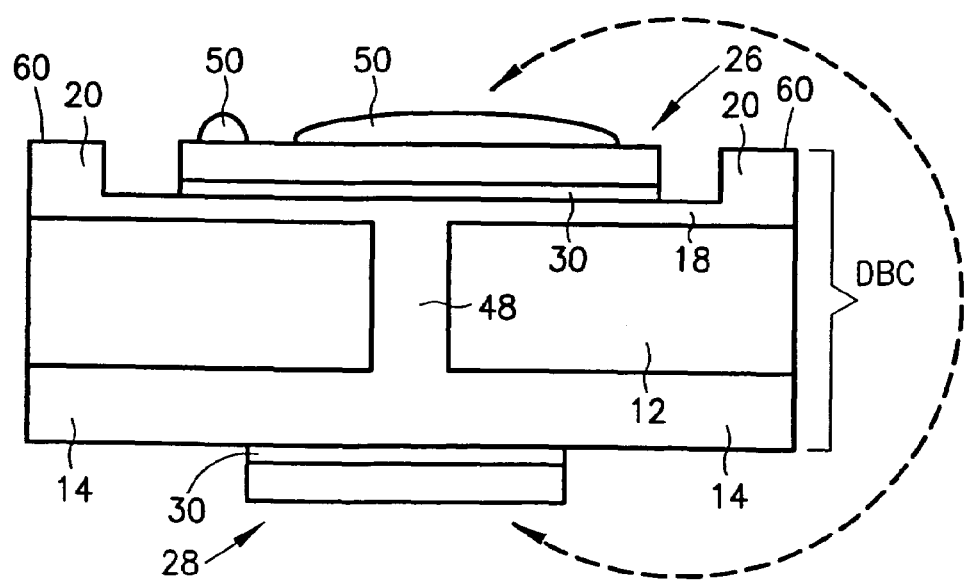
FIG. 5 illustrates a package according to the fourth embodiment of the present invention.

Referring to FIG. 5, in which like numerals identify like features, in a package according to the fourth embodiment, web 18 is electrically connected to metallic body 14 through a conductive filled via 48 that extends through ceramic body 12; for example, a copper filled via which connects web 18 to metallic body 14. The cathode electrode of diode 28 is then electrically and mechanically connected to metallic body 14 using a conductive adhesive 30, and the collector electrode of IGBT die 26 is electrically and mechanically coupled to web 18 through a conductive adhesive body 30. The emitter electrode of IGBT die 26 can then be connected to the anode electrode of diode 28 when the package is assembled on a circuit board or the like substrate in a module or an integrated device. Cu-stripes/clips, a leadframe or even bond wires (but this is not a preferred option) could be used to form that contact. Note that the emitter electrode and the gate electrode each includes a respective solder bump 50 to facilitate flip-mounting of the package.

Figure 6:
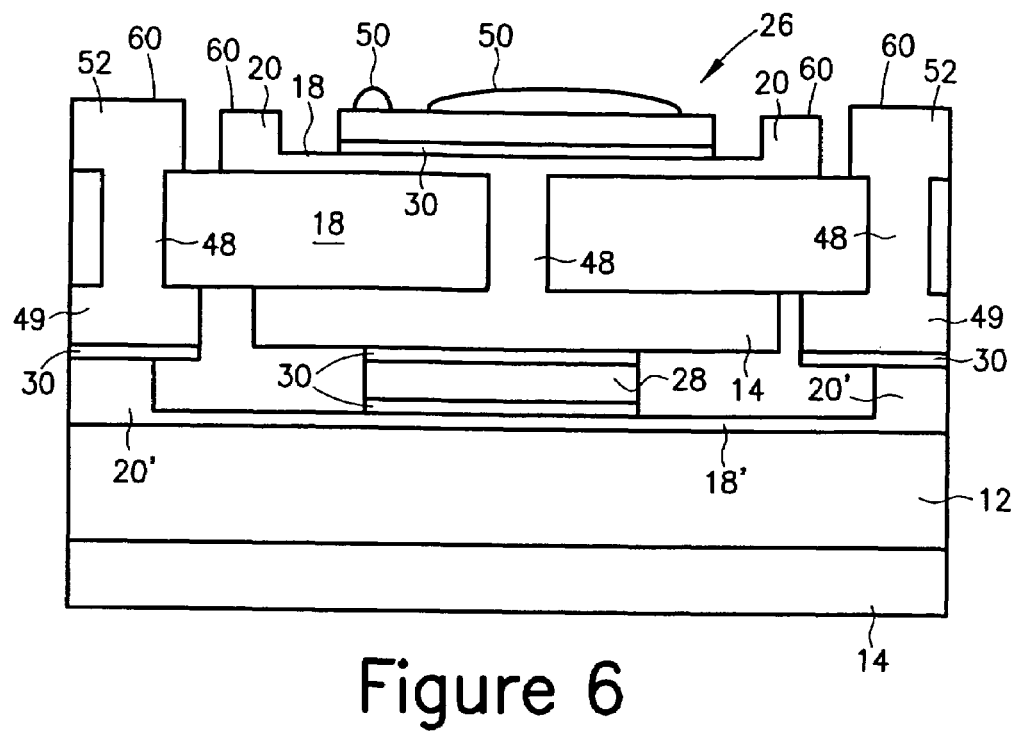
FIG. 6 illustrates a package according to the fifth embodiment of the present invention.

Referring to FIG. 6, in which like numerals identify like features, in a package according to the fifth embodiment, the anode electrode of diode 28 is electrically connected to a web 18' using a conductive adhesive body 30. Web 30 includes leads 20', and is bonded to a ceramic body 12, which is bonded to metallic body 14. Copper, aluminum or the like material can be used to form web 18' and leads 20'. Leads 20' are electrically and mechanically connected to pads 49 using a conductive adhesive body 30. Each pad 49 is electrically connected through a conductive filled via 48 to a respective conductive (e.g. copper) lead 52. Each conductive lead 52 preferably includes a surface for external connection 60 through flip-mounting which is coplanar with connection surfaces of leads 20, whereby the entire assembly is rendered flip-mountable. Note that in a package according to the fifth embodiment only one lead 52 is required, and the second lead is optional and provided for symmetry.

Figure 7:
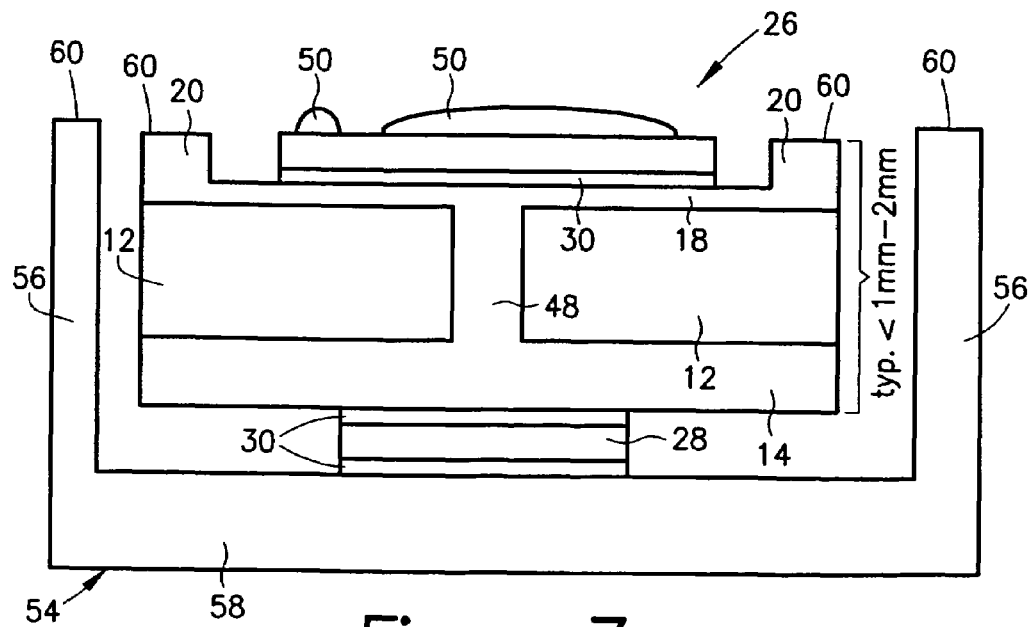
FIG. 7 illustrates a package according to the sixth embodiment of the present invention.

Referring now to FIG. 7, in which like numerals identify like features, in a package according to the sixth embodiment of the present invention, the anode electrode of diode 28 is electrically and mechanically coupled to the interior surface of a metallic clip 54 using a conductive adhesive 30. Metallic clip 54 is formed from copper or the like material and includes legs 56 each extending from an edge or a side of a web portion 58. Each leg includes a surface 60 for external connection which is coplanar with external connection surfaces 60 of leads 20. Note that clip 54 can be copper, an example of which can be found in U.S. Pat. No. 6,624,522, assigned to the assignee of the present application. If the application does not have severe temperature requirements it might be a cost-effective solution to use an outer metal-can as an outer package and as an electric contact from the diode to the front side of the co-package.

Figure 8:
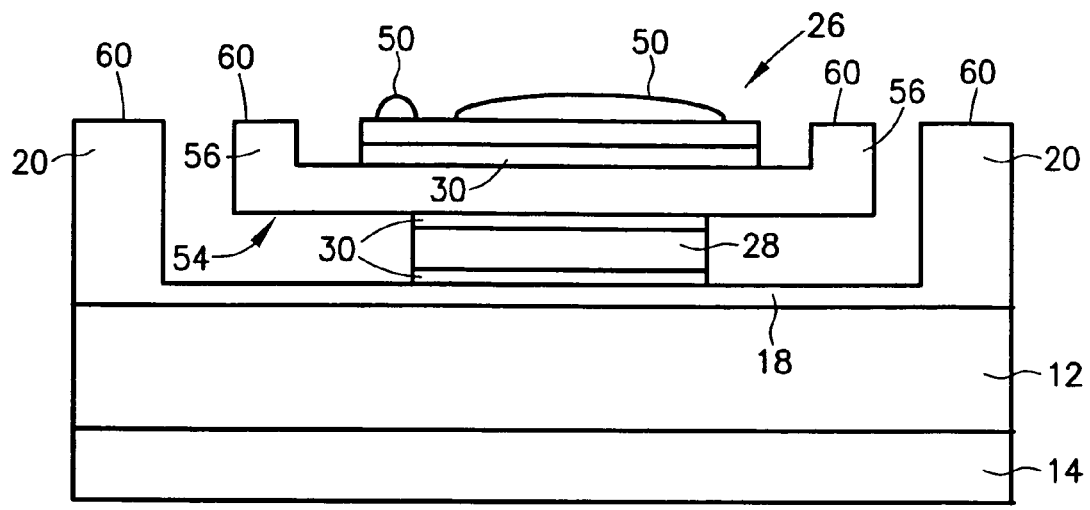
FIG. 8 illustrates a package according to the seventh embodiment of the present invention.

Referring now to FIG. 8, in which like numerals identify like features, in a package according to the seventh embodiment, the anode electrode of diode 28 is electrically and mechanically connected to web portion 18, while the cathode electrode thereof is electrically and mechanically connected to the back surface of a copper clip 54. Copper clip 54 includes web portion 58, and two legs extending from opposite edges of web 58. The collector electrode of IGBT die 26 is electrically and mechanically coupled to the interior surface of web 58, and connection surfaces 60 of leads 20 and legs 56 are coplanar, whereby the entire package is rendered flip-mountable. If the application does not have severe temperature requirements it might be a cost-effective solution to use a metal-can similar to a can disclosed in U.S. Pat. No. 6,624,522 as an inner package and as an electric contact from the IGBT to the diode soldered to the backside of the metal-can. A DBC-can 10 is used as outer package covering the stack.

Figure 9:
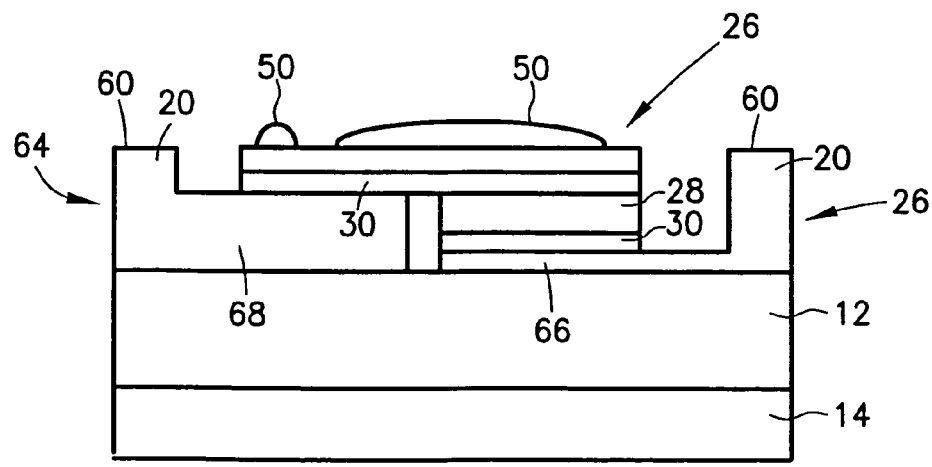
FIG. 9 illustrates a package according to the eighth embodiment of the present invention.

Referring now to FIG. 9, in which like numerals identify like features, in a package according to the eighth embodiment, two connectors 62, 64 are provided. First connector 62 includes a web portion 66 which is bonded to ceramic body 12, and at least one lead 20 extending from an edge thereof.

Web portion 30 is electrically and mechanically connected to the anode electrodes of diode 28, while the cathode electrode of diode 28 is electrically and mechanically coupled to a portion of the collector electrode of IGBT die 26. Second connector 64 also includes a web portion 68 that is bonded to ceramic body 12 and is electrically and mechanically connected to another portion of the collector electrode of IGBT die 26. Note that web portion 68 is separated and spaced from web portion 66 and is thicker than web portion 66 (at least thicker than the combination of diode 28 and web 66). Connector 64 also includes a lead 20 that extends from an edge of web 68, and includes an external connection surface that is coplanar with external connection surface 60 of lead 20 of connector 62.

Figure 10:
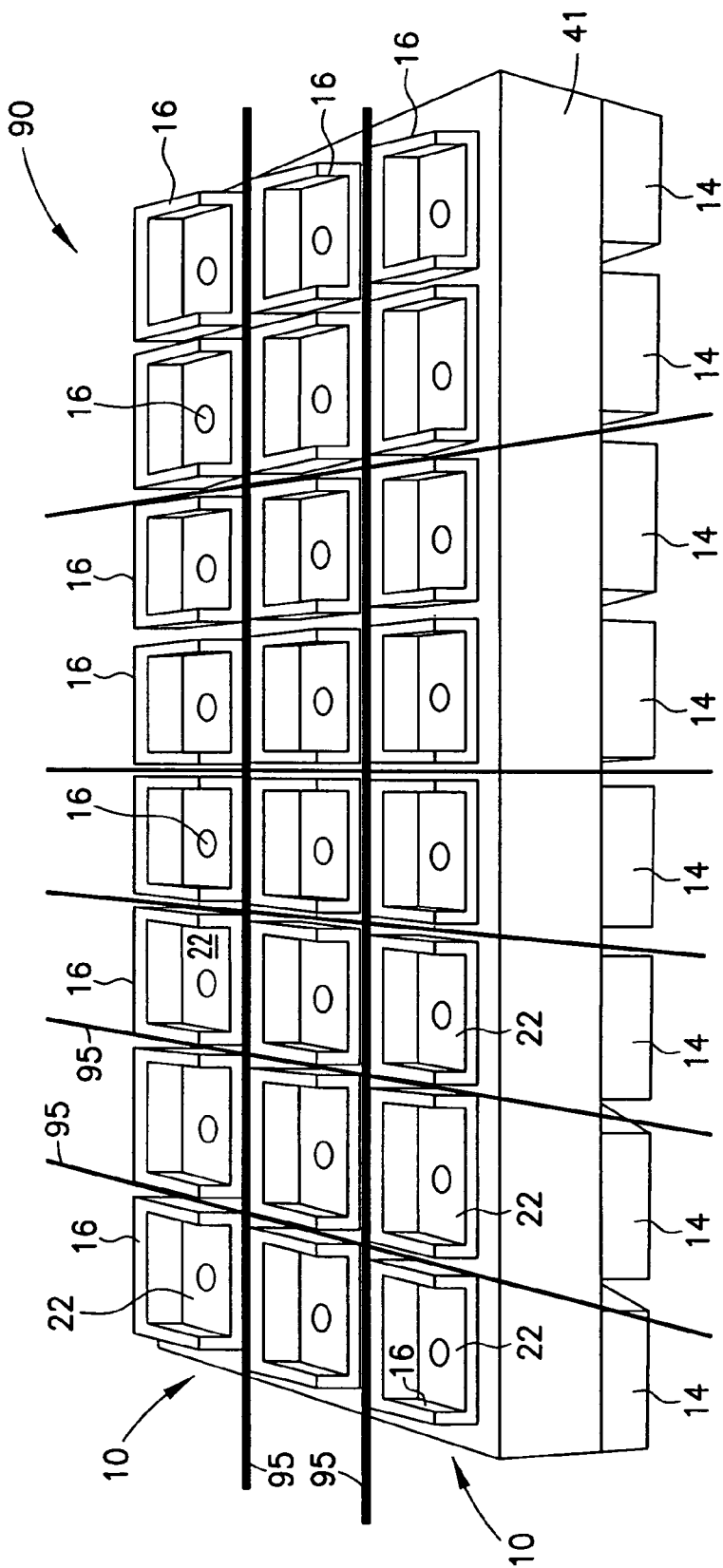
FIG. 10 illustrates DBC card used in the fabrication of packages according to the present invention.

In order to minimize package costs, the packages according to the present invention can be formed simultaneously on a DBC card and then singulated from the card. Thus, a DBC card 90 is shown in FIG. 10. Such cards are produced in sizes such as 5"×7" or 4"×6" and have a continuous central ceramic layer 41 with top and bottom copper layers. These layers can be simultaneously masked and etched to define the individual building blocks (DBC-cans) 10. Specifically, the copper layers are patterned to obtain connectors 16 and metallic bodies 14 spaced by streets 95 and thereafter the die can be loaded onto connections surfaces 22 of each DBC-can 10. Note that connectors 16 can be tested before singulation.

It is very desirable to test connectors 16 before the die are mounted to reduce yield loss. After the tests are carried out and the die are assembled in place, DBC-cans 10 can be singulated by sawing, dicing or physically breaking at the streets 95.

Advantageously, cards 90 can be protected by a suitable foil for shipment and can be pre-scribed for easy break-off or singulation of packages by the end user.

Instead of separating DBC-cans 10 right after production and assembling Si-devices in a single DBC-cans the whole DBC card can be used to perform the Si-die attach. That way placing the die, the soldering and also the end test/parameter testing of the packaged dice can be done more cost-effectively on the DBC card which is faster, easier and more precise than handling discrete devices.

To optimize package performance solder is preferred as high current carrying and low thermal resistance conductive adhesive.

The soldering of the devices into the cans is an important step for the reliability of the packages device. A flat and homogeneous solder layer of exactly defined thickness would be important for the reliability of the solder joint. The solder thickness is the main parameter determining the solder wear out and the occurrence of fatigue, wear out and delamination. Further the solder thickness needs to be controlled in order to level the die surface with the Cu-frame.

During the soldering process the die can move and make contact with connector 16. Such a contact can be avoided.
- by putting an isolating lacquer or a solder stop on the inside of the connector;
- by providing an isolating edge-termination/passivation on the die which should be sufficient to provide edge isolation towards the lead 20. (This technique on a wafer process level is normally more cost effective than mechanical isolation means using a laquer);
- by using a "smooth solder process", e.g. by means of a fluxfree solder (e.g. solder pre-forms instead of solder paste with flux) and by using a vacuum solder process under formic gas atmosphere which will avoid strong movements of the dice inside the DBC-cans and supports keeping the correct die orientation;
- by designing a dimple structure inside of the DBC-can which will work as a fixation of the die during soldering. Besides the dimples will work as a stress release inside of the can for the bond force between Cu and ceramics.

All dice in DBC-cans 10 on DBC card 90 can be tested very efficiently in parallel since the cans are electrically isolated from each other. For example, a special probe-card of a parametric tester can test all dice on the DBC-card 90 at the same time reducing test time enormously and establishing a high production rate to reduce manufacturing costs.

Besides the electric testing after each die attach on a card level also automated visual inspection of the whole card can easily determine if dice are too close to the DBC-frame (leakage currents). So potential miss-assembled dice can be found and inked out without the risk of going to the field.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor package, comprising:
 a metallic body having a web portion configured for electrical and mechanical coupling using a conductive adhesive to active electrodes of at least two semiconductor devices, and a connector portion extending from an edge of said web portion to connect electrically said active electrodes of said semiconductor devices to an external conductive body;
 a first semiconductor die and a second semiconductor die electrically and mechanically coupled to said web portion;
 a ceramic insulation body directly bonded to at one surface thereof to a surface of said metallic body; and
 another metallic body directly bonded to another opposing surface of said ceramic insulation body.

2. The power semiconductor package of claim 1, wherein said metallic body and said another metallic body are comprised of copper.

3. The power semiconductor package of claim 2, wherein said ceramic insulation body is comprised of aluminum oxide.

4. The power semiconductor package of claim 1, wherein said connector is horseshoe shaped.

5. The power semiconductor package of claim 1, further comprising another connector extending from another edge of said web portion opposite said connector.

6. The power semiconductor package of claim 1, wherein said first semiconductor device is an IGBT.

7. The power semiconductor package of claim 1, wherein said second semiconductor device is a diode.

8. The power semiconductor package of claim 1, wherein said web portion is configured for electrical and mechanical connection using a conductive adhesive to an active electrode of another semiconductor device.

9. The power semiconductor package of claim 8, wherein said first semiconductor device is an IGBT and said second semiconductor device is a diode.

10. The power semiconductor package of claim 1, wherein said another metallic body is configured for electrical and mechanical connection using a conductive adhesive to an active electrode of another semiconductor device.

11. The power semiconductor package of claim 10, wherein said first semiconductor device is an IGBT and said second semiconductor device is a diode.

12. The power semiconductor package of claim 1, wherein said active electrode is an emitter electrode of an IGBT.

13. The power semiconductor package of claim 1, wherein said active electrode is a collector electrode of an IGBT.

14. The power semiconductor package of claim 1, wherein said active electrode is a gate electrode.

* * * * *